(12) United States Patent
Nagarkar et al.

(10) Patent No.: US 10,234,573 B2
(45) Date of Patent: Mar. 19, 2019

(54) DIGITAL PROBE

(71) Applicant: Radiation Monitoring Devices, Inc., Watertown, MA (US)

(72) Inventors: Vivek V. Nagarkar, Weston, MA (US); Bipin Singh, Chelmsford, MA (US); Hamid Sabet, Watertown, MA (US); Haris Kudrolli, Watertown, MA (US)

(73) Assignee: RADIATION MONITORING DEVICES, INC., Watertown, MA (US)

( * ) Notice: Subject to any disclaimer, the term of this patent is extended or adjusted under 35 U.S.C. 154(b) by 0 days.

(21) Appl. No.: 15/677,629

(22) Filed: Aug. 15, 2017

(65) Prior Publication Data

US 2018/0052241 A1 Feb. 22, 2018

Related U.S. Application Data

(60) Provisional application No. 62/376,711, filed on Aug. 18, 2016.

(51) Int. Cl.
*G01T 1/20* (2006.01)
*C23C 14/18* (2006.01)
*C23C 14/02* (2006.01)
*G01T 1/202* (2006.01)

(52) U.S. Cl.
CPC ............ *G01T 1/2018* (2013.01); *C23C 14/02* (2013.01); *C23C 14/18* (2013.01); *G01T 1/2023* (2013.01)

(58) Field of Classification Search
CPC ........ G01T 1/2018; C23C 14/02; C23C 14/18
See application file for complete search history.

(56) References Cited

U.S. PATENT DOCUMENTS

| 8,068,896 | B2 | 11/2011 | Daghighian et al. | |
| 2004/0042585 | A1* | 3/2004 | Nagarkar | G21K 4/00 378/98.8 |
| 2011/0163237 | A1* | 7/2011 | Akers | G01T 1/203 250/362 |
| 2012/0068076 | A1* | 3/2012 | Daghighian | A61B 6/037 250/363.03 |
| 2012/0091456 | A1* | 4/2012 | Kelley | H01L 23/573 257/49 |
| 2013/0341516 | A1* | 12/2013 | Ishida | G01T 1/2006 250/363.02 |

(Continued)

OTHER PUBLICATIONS

Analog Devices Data Sheet, AD590 "2-Terminal IC Temperature Transducer" Last Content Update: Feb. 23, 2017, Rev. G, pp. 1-16.

(Continued)

*Primary Examiner* — Hugh H Maupin
(74) *Attorney, Agent, or Firm* — Burns & Levinson LLP; Orlando Lopez

(57) ABSTRACT

A dual-mode, hand-held, digital probe, designed to rapidly localize tissues of interest through gamma detection, and provide high-resolution, real-time images of the suspect area by sensing beta radiation is presented. A position-sensitive solid-state photomultiplier is optically bonded with a hybrid scintillator including a thin Crystalline Microcolumnar Structure (CMS) CsI:T1 scintillator, vapor-deposited directly onto a monolithic (polycrystalline) LYSO scintillator.

17 Claims, 13 Drawing Sheets

(56) References Cited

U.S. PATENT DOCUMENTS

2015/0003584 A1* 1/2015 Weisfield ............ G01T 1/2018
378/62

OTHER PUBLICATIONS

Hamid Sabet, et al., "A Hand-Held, Intra-Operative Positron Imaging Probe for Surgical Applications" IEEE Transactions on Nuclear Science, vol. 62, No. 5, Oct. 2015, pp. 1927-1934.

V. V. Nagarkar, T. K. Gupta, S. R. Miller, Y. Klugerman, M. R. Squillante, G. Entine, "Structured CsI (Tl) scintillators for X-ray imaging applications," IEEE Trans. on Nucl. Sci, 45, No. 3, pp. 492-496, 1998.

Kudrolli et al., "A novel sensor for high throughput preclinical radiotracer imaging, Medical Imaging" 2013: Physics of Medical Imaging, edited by Robert M. Nishikawa, Bruce R. Whiting, Christoph Hoeschen, Proc. of SPIE vol. 8668, 866809• © 2013 SPIE.

Hal O. Anger, Sensitivity, Resolution, and Linearity of the Scintillation Camera, IEEE Transactions on Nuclear Science, Jun. 1966.

Wong et al., "A High Count Rate Position Decoding and Energy Measuring Method for Nuclear Cameras Using Anger Logic Detectors", IEEE Transactions on Nuclear Science, vol. 45, No. 3, Jun. 1998.

* cited by examiner

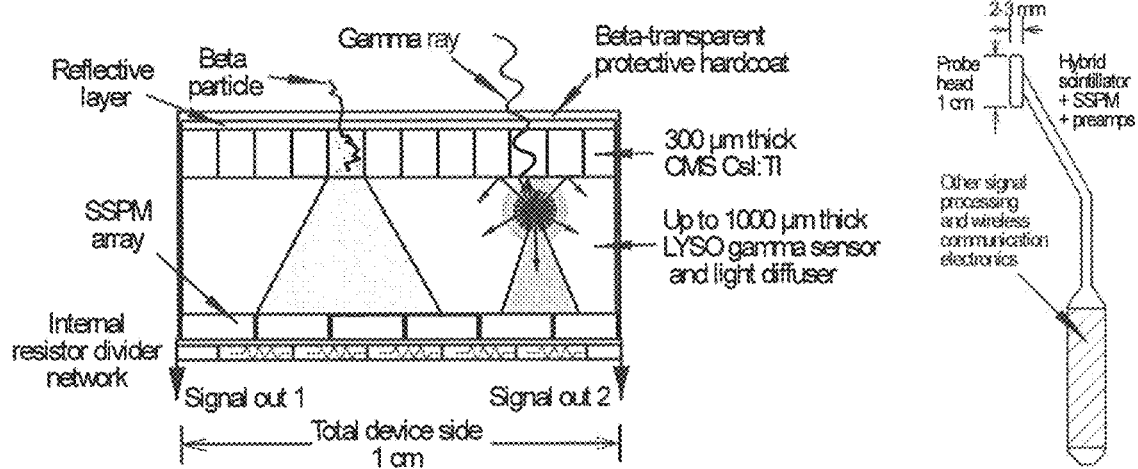
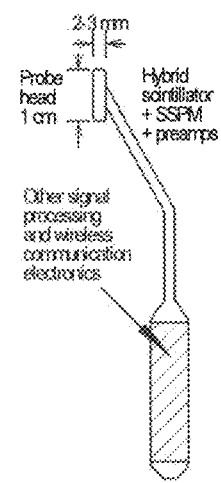
FIG. 1a
FIG. 1b

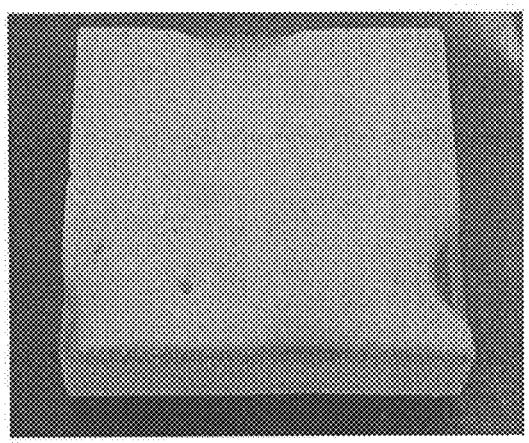 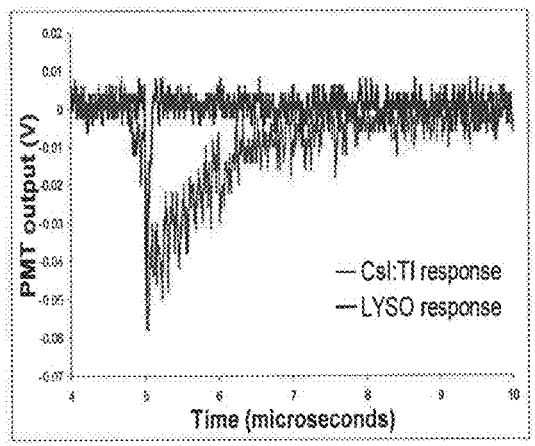
FIG. 4aFIG. 4b

DIGITAL PROBE

CROSS-REFERENCE TO RELATED APPLICATIONS

This application claims priority to U.S. Provisional Patent Application No. 62/376,711 filed on Aug. 18, 2016, entitled DIGITAL PROBE, which is incorporated by reference herein in its entirety for all purposes.

STATEMENT REGARDING FEDERALLY-SPONSORED RESEARCH OR DEVELOPMENT

This invention was made under National institutes of Health (NIH) Contract No. 2R44CA168100-03A1. The government has certain rights to this invention.

BACKGROUND

Intraoperative probes that are guided by radiolabeled tracers increase the specificity of tissue biopsies, enable minimal-access incisions, reduce inpatient hospital utilization, and contribute to improved patient recovery. Intraoperative probes have been used in the treatment of cutaneous melanoma, squanious cell carcinoma, breast carcinoma, thyroid tumors, and parathyroid adenoma. At present, most such probes on the market are non-imaging, and provide no ancillary information of surveyed areas, such as clear delineations of malignant tissues. These probes are usually gamma-sensitive, and are used in conjunction with radiopharmaceuticals such as $^{18}$FDG, $^{99m}$Tc, $^{131}$I, $^{111}$IN or $^{125}$I. One such probe, based on a CdTe sensor, has been supplied on an OEM basis to U.S. Surgical and sold directly under the brand name Navigator™.

The major drawback of existing gamma probes is their inability to distinguish between the signal from the tissue directly in front of the face of the probe head and the background resulting from surrounding tissues. Although they allow the surgeon to locate the approximate area of a tumor, they provide no delineation of the tumor site or tumor bed. This is an important issue, since the excision of all tumor tissue and minimal healthy tissue is important for the recovery, health and even survival of the patient.

An alternative approach in the design of surgical probes with higher spatial accuracy is to make the detector selectively sensitive to short-range radiation, such as beta rays. $^{18}$F-FDG, the FDA-approved widely used radiotracer for oncology, is both a beta and gamma emitter. Detection mechanisms can be implemented in a hardware-software imager design that will effectively measure gammas in order to navigate to a tumor site, and then subtract the gamma background, allowing real-time beta imaging with high contrast and high signal-to-noise ratio (SNR). Such a mechanism would be particularly effective when the probe is used near organs with high uptakes of the radiotracer, such as the bladder, heart, or brain, and can therefore generate background that prevails over the signal.

It would therefore be useful to develop a tool that surgeons can use to navigate to tumor sites and delineate the tumor site from surrounding tissue. Such a device can be made in a compact form, making it easy to use during surgery.

SUMMARY

The teachings described herein include a novel, dual-mode hand-held, digital probe, designed to rapidly localize tissues of interest through gamma detection, and provide high-resolution, real-time images of the suspect area by sensing beta radiation. In one or more embodiments, a position-sensitive solid-state photomultiplier is optically bonded with a unique hybrid scintillator including a thin Crystalline Microcolumnar Structure (CMS) CsI:T1 scintillator, vapor-deposited directly onto a monolithic (polycrystalline) LYSO scintillator. The CMS CsI:T1 acts primarily as a beta detector, whereas the LYSO senses and/or images the gamma background, which can be used to correct the beta image for improved contrast and SNR, as well as acting as a gamma probe for locating gamma-emitting tissues. Employing a solid-state photomultiplier (SSPM) eliminates the bulk of a conventional photomultiplier tube (PMT), and the position-sensitive SSPM (PS-SSPM) described herein further reduces the number of readout channels as compared to commercially available silicon photomultipliers (SiPMs), thereby allowing the economical fabrication of a miniaturized sensor head ideal for intraoperative use.

An imaging probe of this type would be a highly valuable tool, with the potential to revolutionize the surgical field. The teachings described herein would be most helpful in small, targeted areas, along with its use to determine the adequacy of margin resection. These areas might include, but are not limited to, the skull base, carotid sheath, mediastinum, and/or those in close proximity to nerve trunks. In such areas, adequacy of excision may or may not require resection or sacrifice of critical structures, which can dramatically alter the surgical procedure and its outcome. This form of intraoperative imaging has the potential to localize suspected areas of neoplastic disease that are currently only detected by PET and are invisible to conventional imaging and the naked eye.

Various possible clinical IBP applications include:

Treatment of head and neck melanoma and squamous cell carcinoma, as well as thyroid malignancies.

Surgery involving the female reproductive system via laparotomy and other means.

Surgery of the abdomen and thorax, typically via laparotomy, thoracotomy and mediastinotomy.

Surgery of the skin to remove melanomas via excision or via Mohs surgery.

Other clinical applications are within the scope of these teachings.

BRIEF DESCRIPTION OF THE DRAWINGS

The foregoing and other objects, features and advantages will be apparent from the following more particular description of the examples, as illustrated in the accompanying drawings in which like reference characters refer to the same parts throughout the different views. The drawings are not necessarily to scale, emphasis instead being placed upon illustrating the principles of the examples.

FIG. 1a is Schematic of the beta imaging probe head of these teachings;

FIG. 1b is a graphical schematic representation of a probe design of these teachings;

FIG. 3a shows Amorphous microcolumnar CsI:T1 film and FIG. 3b shows Crystalline Microcolumnar (CMS) film; both FIG. 3a and FIG. 3b show highly organized ~10 μm diameter columns;

FIG. 4a is an image of a hybrid CsI:T1-LYSO scintillator of these teachings; the indentations at the edges are due to the holder that held the LYSO substrate in the CsI:T1 deposition chamber;

FIG. 4b is a graphical representation of the response of the dual mode scintillator to $^{18}$F; the responses of the two scintillators can easily be distinguished from their pulse shape;

FIG. 5b shows an image of a positron source obtained by placing a 0.5 mm thick brass plate drilled with two 0.5 mm holes separated by 1.0 mm between a drop of 5 μm $^{18}$F and the detector; the positrons from the $^{18}$F drop traveled through the holes and interacted with the CsI:T1 to form the beta image only when the brass piece was within a couple of millimeters of the detector; Since the holes and the CsI:T1 pixels were almost the same size, the positrons from one hole interacted with 4 CsI:T1 pixels; FIG. 5c shows an image obtained using a similar approach as in the image of FIG. 5b, but with the syringe filled with 1 mCi $^{18}$F at a distance of 30 cm to see the effect of gamma background; the background noise increased but did not degrade the image appreciably; FIG. 5d shows an image obtained using a similar approach as in the image of FIG. 5b, but with the syringe placed at 8 cm from the phantom; background increased significantly, but the beta image was still visible:

DETAILED DESCRIPTION

Figure 2A:
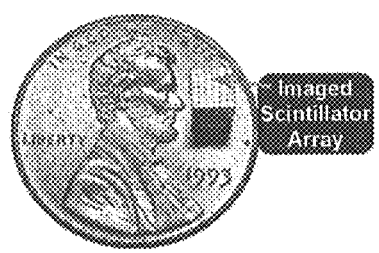
FIG. 2a is an image of a segmented LYSO scintillator array.
Figure 2B:
FIG. 2b is an image of the SSPMs used in these teachings.
Figure 2C:
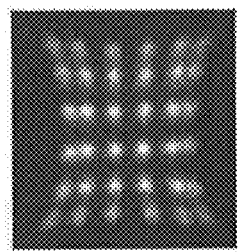
FIG. 2c is an image generated by coupling the LYSO array of these teachings to the PS-SSPM of these teachings and irradiating them with a flood-field of gamma rays; as seen, the location of each scintillation segment is clearly resolved (the pincushion effect is corrected in software.
Figure 2D:
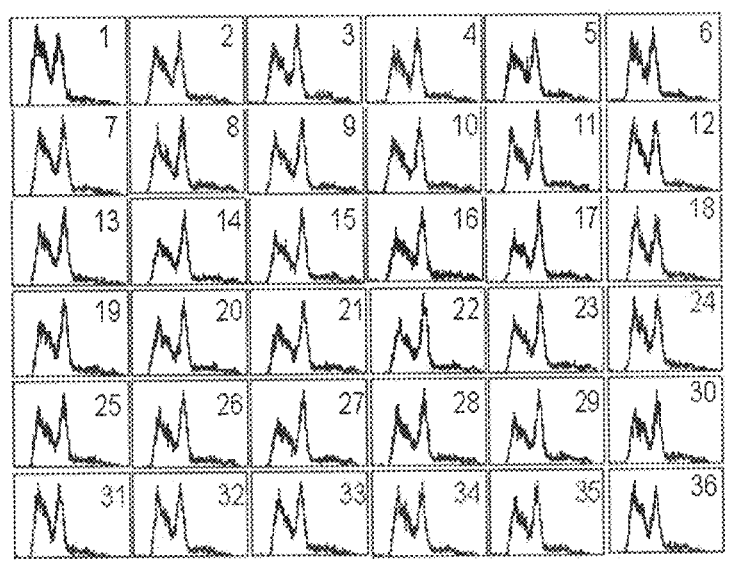
FIG. 2d shows the energy spectrum obtained for each of the scintillation segments resolved in the image.

In the description that follows, like components have been given the same reference numerals, regardless of whether they are shown in different examples. To illustrate an example(s) of the present teachings in a clear and concise manner, the drawings may not necessarily be to scale and certain features may be shown in somewhat schematic form. Features that are described and/or illustrated with respect to one example may be used in the same way or in a similar way in one or more other examples and/or in combination with or instead of the features of the other examples.

As used in the specification and in the claims, the singular form of "a" "an", and "the" include plural referents unless the context clearly dictates otherwise.

As used in the specification and in the claims, for the purposes of describing and defining the teachings, the terms "about" and "substantially" are used represent the inherent degree of uncertainty that may be attributed to any quantitative comparison, value, measurement, or other representation. The terms "about" and "substantially" are also used herein to represent the degree by which a quantitative representation may vary from a stated reference without resulting in a change in the basic function of the subject matter at issue.

In one or more embodiments, the imaging probe of these teachings includes a slab of crystalline $Lu_{1.8}Y_{0.2}SiO_5$:Ce (LYSO) scintillator, a crystalline micro-columnar structure (CMS) CsI:T1 scintillator disposed on the slab of crystalline LYSO scintillator and a solid-state photomultiplier array disposed under the slab of crystalline LYSO scintillator; the solid-state photomultiplier array optically disposed to receive light emanated from the slab of crystalline LYSO scintillator and the CMS CsI:T1 scintillator. In one embodiment, the imaging probe of these teachings also includes a reflective layer disposed on the CMS scintillator; the reflective layer configured to reflect back light emanating from the CMS CsI:T1 scintillator. In one instance, the reflective layer comprises aluminum. In one specific instance, the reflective layer has a thickness of about 100 nm; and the aluminum is deposited by a thermal evaporation process. In one instance, the slab of crystalline LYSO has a thickness between about 500μ and about 1000 μm; and the CMS CsI:T1 scintillator has a thickness between about 300μ and about 400 μm.

In another embodiment, the imaging probe of these teachings also includes a protective coating disposed on the reflective layer; where in the protective coating is substantially transparent to β radiation. In one instance, the protective coating instance a material selected from one of a poly(p-xylylene) polymer (such as Parylene), TiN, BN, $Al_2O$, $Lu_2O_3$; and where in a thickness of the protective coating is between about 50 nm and about 100 nm.

In other embodiments, the imaging probe of these teachings also includes an analysis component configured to discriminate between light emanating due to β radiation and light emanating due to γ radiation, determine a background signal from the light emanating due to γ radiation; and subtract the background signal from the signal due to β radiation, the analysis component being electrically disposed receive output signals from the solid-state photomultiplier array. The analysis component can be configured to perform the above described functions by either a processor executing computer readable code that causes the processor to perform the above described functions (the computer readable code being stored in a computer usable media) or dedicated electronics, such as ASICs or FPGAs, designed to perform the above described functions. In one instance, the analysis component is also configured to apply Anger logic, also referred to as a centroid calculation, to said output signals, in order to determine positions of interactions of β radiation with the CMS CsI:T1 scintillator.

In one or more instances, the analysis component includes an amplifier component electrically disposed to receive said output signals; and an analog to digital converter component electrically disposed to receive output from the amplifier component.

Referring now to FIGS. 1a-b, the dual-mode, hand-held, digital probe of these teachings is shown, including the SSPM. An SSPM is an array of Geiger photodiode (GPD) elements, where each element is essentially a Geiger detector for optical photons. The SSPM achieves the low noise of a PMT, at low cost, while retaining the high quantum efficiency of a silicon device when coupled to a scintillator. Implementing SSPMs in a CMOS-compatible process yields high-precision, low-cost sensors with the additional benefit of signal processing electronics integrated right on the chip. Recent advances in CMOS SSPMs include sensors of a small finite size technology (0.18 pm) that provide performance enhancements such as (1) facilitating the integration of circuit components with the sensor, (2) reducing dark current by factor of 10, (3) increasing the fill factor, and (4) improving sensitivity to blue and UV light.

In Anger (a.k.a. gamma) cameras, scintillation light is typically distributed over a number of PMT sensors, and the signals from the PMTs are summed in a charge-dividing resistive network. The ratios of the signals at four contacts of the resistive network yield the X-Y location of the scintillation event, while the sum yields the energy. An analogous charge-sharing resistive network has been integrated into tom PS-SSPM designs, where the ratios of the signals at four readout contacts determine the location of the event, and the sum of the signals determines event energy. Thus, the PS-SSPM reduces the number of channels that must be read out, which significantly reduces the size, complexity and cost of the IBP readout electronics. The internal resistive network minimizes stray capacitance, which minimizes shaping time and maximizes the count rate for improved SNR performance.

In another embodiment, a commercially available SiPM from SensL, the ArraySM4-30035-CER, was used as the SSPM. ArraySM4-30035-CER is a 16 element SiPM array based on a 4×4 arrangement of 3 mm pixels mounted in a low profile ceramic package. The ArraySM-4 is sensitive to visible light in the range of 400 nm to 1000 nm. SensL's SiPM devices or other SSPM devices should be compared in terms of performance to RMD's SSPM devices in regards to detection efficiency and dark current. An SSPM is selected from such a comparison.

FIGS. 2a-d show a photograph of a segmented LYSO scintillation array, next to a photograph of a 5×5 mm² PS-SSPM and the excellent pixel separation obtained under flood field illumination using 511 keV $^{22}$Na y-rays, using a pixelated LYSO/PS-SSPM combination. As seen in the image, the relative location of each scintillation segment is cleanly resolved. The plot to the right of the image shows the energy spectrum obtained for each of the scintillation segments resolved in the image. Thus, some advantages of PS-SSPMs for the IBP application include: (1) high gain of $10^6$, similar to conventional PMTs, (2) low voltage operation as opposed to the high voltage needed for conventional PMTs, (3) small footprint compared to PS-PMT bulk, (4) only 4 electrical contacts, in contrast to the N×M contacts needed for N×M pixelated SiPMs/SSPMs, (5) excellent spectral sensitivity for both 540 rim CsI:T1 and 420 nm LYSO emissions, (5) internal resistive network to minimize stray capacitance, which speeds up the shaping time and maximizes the count rate for improved SNR performance, and (6) insensitivity to magnetic fields, unlike PMTS.

Another aspect of the teachings described herein is the fabrication of a thin and higher effective Z microcolumnar CsI:T1 scintillator, deposited directly onto a thin slab of crystalline LYSO ($Lu_{1.8}Y_{0.2}SiO_5(Ce)$) scintillator, to form the hybrid scintillator, as shown in FIG. 1. While the CsI:T1 acts primarily as a beta detector, it also detects a certain amount of gamma rays. The LYSO detects the gamma background and acts as a controlled diffuser for the CsI:T1 scintillation light, spreading it sufficiently to allow multiple PS-SSPM macro-pixels to sense it for accurate centroid estimation.

Figure 3A:
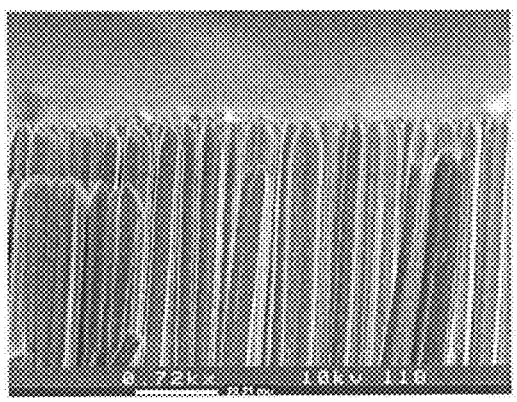
FIGS. 3a and 3b show microcolumnar CsI:T1 film.
Figure 3B:
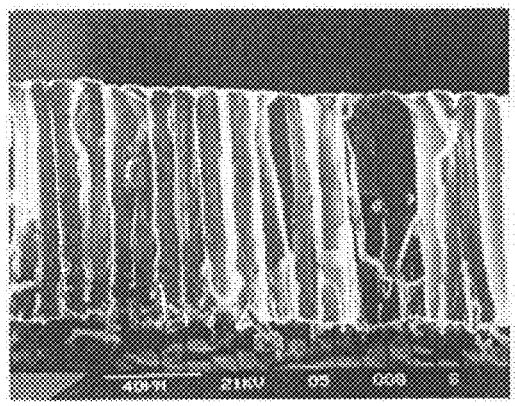

The individual columns of the Crystalline Microcolumnar Structure (CMS) CsI:T1 scintillator are crystalline and completely transparent (FIG. 3), unlike the current amorphous microcolumnar CsI:T1. While deposition techniques that produce high-resolution amorphous microcolumnar CsI:T1 structures currently used in commercial digital radiography systems have been perfected over the past 15 years (FIG. 3), the proposed CMS CsI:T1 is unique to the teachings described herein. It improves upon commercial scintillators in several respects:

The density of the resulting CMS film is equal to the material density of CsI:T1, which is 4.54 g/cc, compared to significantly lower densities of 3.7 to 4.1 g/cc observed in AMS-type scintillators. This allows for a thin scintillator of 300 μm to detect 100% of the 13 events, which improves spatial resolution.

The emission efficiency of the CMS CsI:T1 is equivalent to that of crystalline CsI:T1, measuring—16 eV/optical photon or 60,000 photons/MeV, compared to 45,000 photons/MeV common in AMS-type scintillators, which improves the SNR.

The CMS CsI:T1 scintillator is deposited directly onto the LYSO diffuser/7-scintillator to maximize light collection efficiency and control light transport to the surface of the PS-SSPM.

The choice of LYSO as a γ detector in the proposed hybrid scintillator is based on its:

High γ absorption efficiency, due to its high atomic number ($Z_{e}ff$=62.3) and high density (p=7.1 g/cc).

High transparency to its own 420 nm emission and the 540 nm emission of CsI:T1.

Faster principal scintillation light decay time (41 ns) compared to that of CsI:T1 (−1 μs), easing discrimination according to pulse shape and duration of scintillations occurring in the two materials. (The discrimination due to decay times is referred to as pulse shape discrimination-PSD.)

High temperature tolerance and availability in the required dimensions, which makes LYSO an excellent substrate, permitting the high temperature deposition needed for CMS CsI:T1 foliation.

LYSO contains up to—0.6% of 1.76 Lu, a beta emitter (half-life 3.78×10$^{1°}$ years), but its 1.193 MeV betas are distinguishable from lower-energy scintillations produced by beta-emitting radioisotopes of interest.

The combination of high β stopping power, low β sensitivity, and high scintillation efficiency provided by the thin CMS films, excellent light channeling properties of their fine, highly transparent crystalline scintillator columns, and controlled spread of light for effective Anger-type logic implementation, permits beta detection with high resolution, high efficiency, and high SNR for radionuclides, including those typically used in radio-guided surgery. The γ background measured by the LYSO is effectively subtracted from the beta image for improved contrast and SNR, while the same γ ray signal is useful in navigating the probe to locations of interest. Such a signal is amplified, added to that from the CsI:T1 beta sensor, and used to derive audio/visual signals. Based on the frequency of the audio tone or appearance of the visual signal, the surgeon is able to zero in on the desired location quickly.

PS-SSPM operation is specified at room temperature of 25° C., without active cooling. However, the IBP operates at a human body temperature of 37° C., which poses some challenges. With an integration time of 1 μs (decay time of CsI:T1), room temperature dark current contributes a background of 30+/−5 triggered GPD elements/mm$^2$. Increased operating temperature doubles the anticipated background every 8° C., so the worst case background at body temperature is a factor of less than four higher, or <120 triggered GPD elements/mm$^2$. The background also scales with the area, which is a factor of 100 higher for the 1×1 cm$^2$ device compared to the 1×1 mm$^2$ device. Thus, 120×100 (12,000) GPD elements/cm$^2$ are triggered at 38° C. The noise, therefore, is the square root of 12,000, or—110. Thus, so long as the β event triggers 110×2 (220) GPD elements, the SNR Should be 2:1. The CMS CsI:T1 yields—60 ph/keV. Conservatively assuming that only 50% of the generated photons reach the PS-SSPM, and assuming photon detection efficiency of the PS-SSPM for 550 nm CsI:T1 light to be 35%, and additional losses of 10% due to coupling inefficiencies, a total of 10 GPD elements will be triggered per keV of deposited energy (60*0.5*0.35*0.90, or—10 photons trigger GPDs). Therefore, to achieve a SNR of 2:1, the minimum β energy deposited in the CsI:T1 should be 22 keV. Although the end point energy of FDG 18 positron (p−) is 635 keV, by the time positrons emerge from the tissue and interact in the scintillator, a significant fraction of their energy is lost and average 13 energy is between 50 to 150 keV. To further enhance sensitivity and improve signal detection above noise, the following are implemented in some embodiments:

Devise SSPM design configurations that will reduce the background. These include segmented SSPM configurations that reduce the effective area of the detector and optimize the shaping time.

Use active device cooling using thereto-electric cooling or even chilled air or water flow.

Determining the optimal-SSPM configuration and optimal IBP design also requires research into the effects of non-uniform illumination on SSPM performance, and quantification of the dark current and its effect on position and energy resolution. This distribution not only affects the energy resolution, but also the position resolution when dividing the charge in a charge sharing network.

Figure 6:
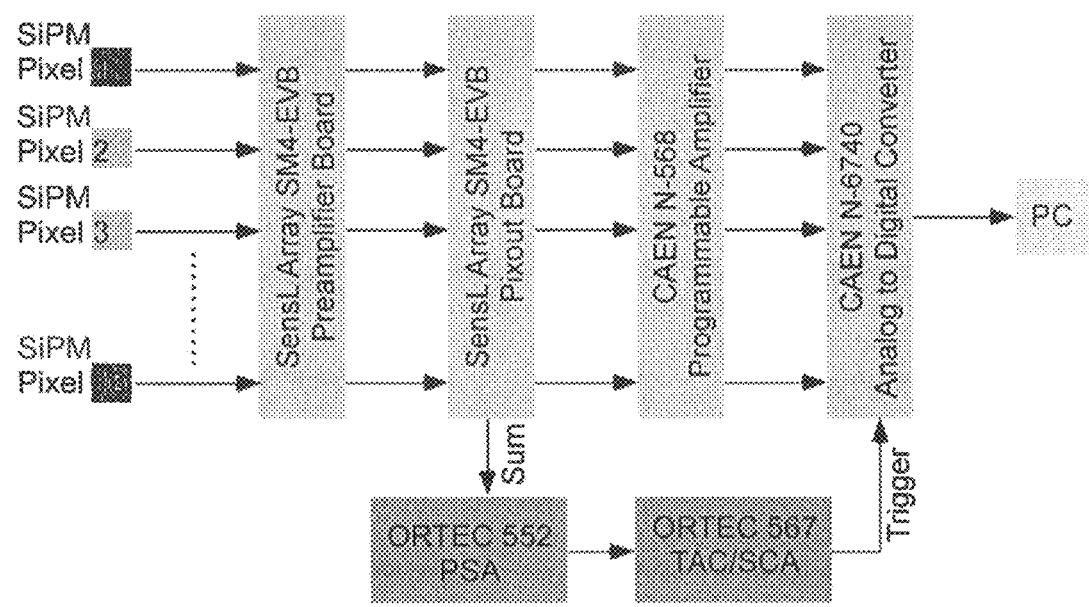
FIG. 6 shows data acquisition setup for the one embodiment of the digital probe of these teachings; the PSD is implemented using ORTEC 552 PSA and 567 TAC/SCA units.
Figure 7:
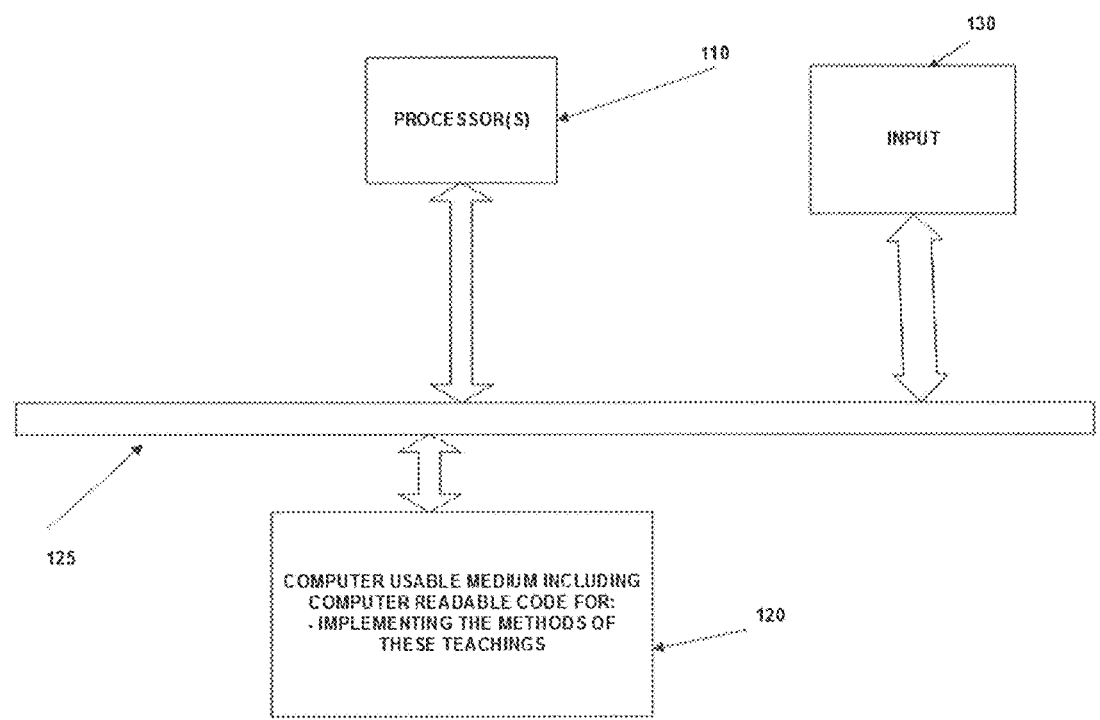
FIG. 7 shows one embodiment of the computer system (PC) used in one embodiment of the data acquisition setup of these teachings.
Figure 8A:
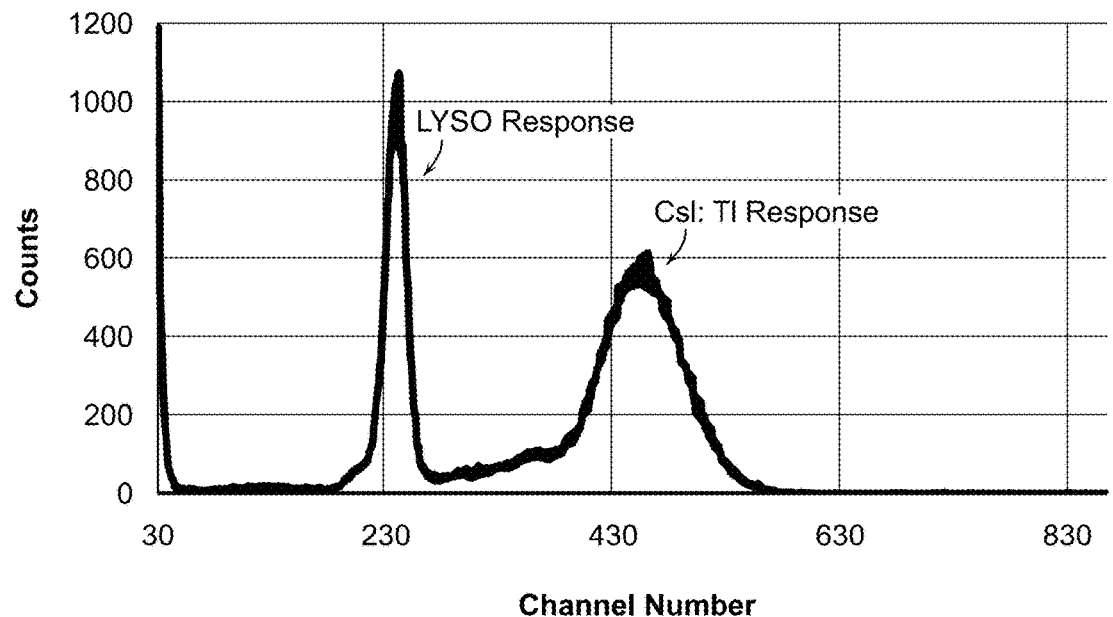
FIG. 8A and FIG. 8B show Energy (8a) and time (8b) spectra of the hybrid scintillator exposed to 122 keV γs; due to the longer decay time of the CsI:T1, the LYSO signal can be rejected using PSD.
Figure 8B:
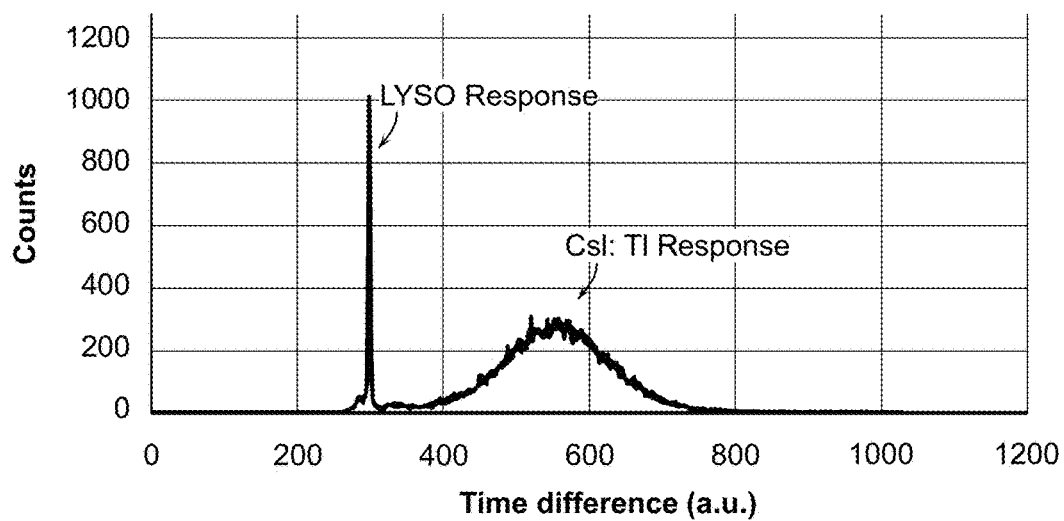

In one embodiment of the digital probe of these teachings, the probe is connected to downstream electronics using a flexible flat cable (FFC). In one instance, hybrid scintillator was optically coupled to an ArraySM-4 SiPM array from SensL, as the SSPM, using Dow Corning Q2-3067 optical gel. The SiPM has a 4×4 array of pixels, each 3×3 mm$^2$ with 3.36 mm pixel pitch. The effective area of the array is 13×13 mm$^2$. The array is readout using a 16 channel PreAmp board which delivers the SSPM signals through a 1 meter long FFC to the Pixout board. The Pixout board provides easy access to individual SSPM signals, as well as the sum of all SiPM signals. The SSPM signals are then shaped and further amplified by a 16 channel spectroscopy amplifier. The output signals of this board are then fed to a multi-channel analog-to-digital converter (ADC). The sum of all signals from the Pixout board is further processed by a PSD circuit, implemented using Nuclear Instrumentation Module (NIM) bins, and then used to trigger the ADC unit. A schematic diagram of the data acquisition system is shown in FIG. 6. The collected raw data is finally processed by a PC. FIG. 7 shows a configuration of a typical PC. Referring to FIG. 8, in the embodiment shown there in, one or more processors 110 are operatively connected to computer usable media 120 that has computer readable code embodied therein, which, when executed by the one or more processors 110, causes the one or more processors to perform the method of these teachings. An input device 130 is operatively connected to the one or more processors 110 and to the computer usable media 120 and enables the inputs from the analog-to-digital converter. The one or more processors 110, the computer readable media 120 and the input device 130 are operatively connected by means of a computer connection component 125 (such as a computer bus).

An Anger logic (centroid method) is applied to the 16 signals to estimate the position of β interactions (for Anger logic, see Hal O. Anger, Sensitivity, Resolution, And Linearity of the Scintillation Camera, IEEE Transactions on Nuclear Science, June 1966 or A High Count Rate Position Decoding and Energy Measuring Method for Nuclear Cameras Using Anger Logic Detectors, IEEE Transactions on Nuclear Science, Vol. 45, NO. 3, June 1998, both of which are incorporated by reference here in in their entirety and for all purposes).

After assembling the detector head we tuned the PSD electronics to effectively eliminate the signals originated in LYSO. Although pulse height discrimination (PHD) can be applied, the LYSO signal was filtered only by the PSD electronics based on the shorter decay time of LYSO compared with CsI:T1 (see FIGS. 8A, 8B).

Figure 9A:
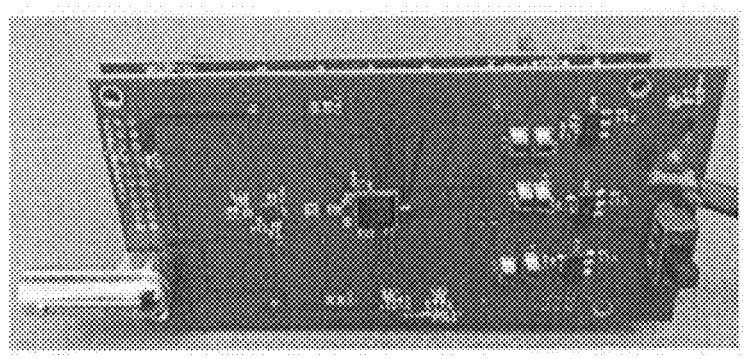
FIGS. 9A and 9B are pictorial representations of the custom readout electronics using one embodiment of the system of these teachings.
Figure 9B:
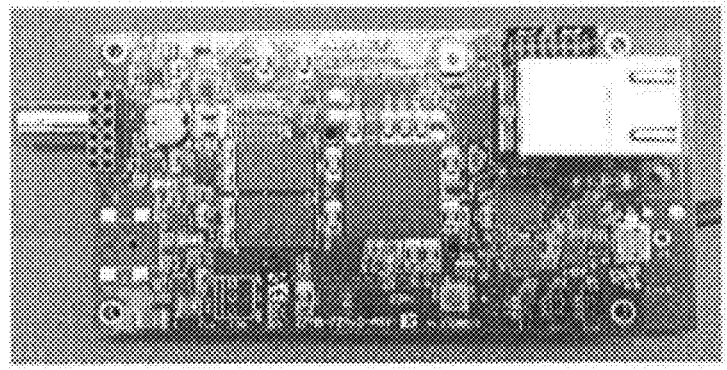

In another embodiment, dedicated electronics perform the data acquisition functions on board along with the signal processing circuitry. The SSPM is electronically coupled to an amplifier to convert the single ended pulse into a differential pair. The pulse is then be converted using a high-speed ADC (FIG. 9A) and interfaced with a field-programmable gate array (FPGA, FIG. 9B). The FPGA captures and processes the data, such as performing an integration to estimate the energy deposited as well as the PSD. Tools (such as Xiliinx Vivado) are used to develop new signal processing logic within the FPGA for program specific goals, such as the PSD implementation in this case. The processed data is sent to an interfacing computing component, such as shown in FIG. 7, for further handling (storage, display, or histogram generation).

Figure 10:
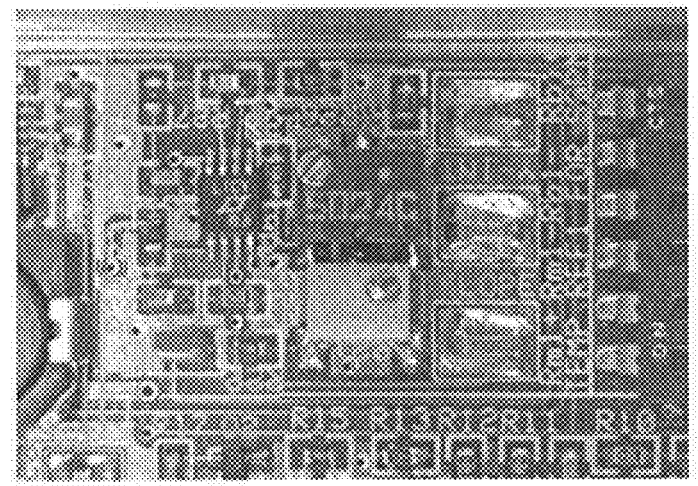
FIG. 10 is a pictorial representation of the circuit used to convert the transducer current into a reference voltage used to generate the bias voltage to the SSPM in one embodiment of the system of these teachings.
Figure 11:
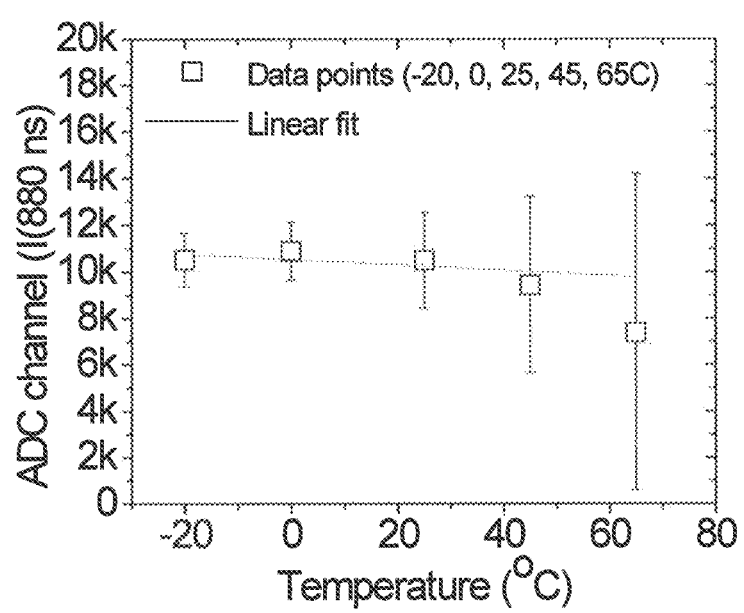
FIG. 11 is a graphical representation showing the gain stability obtained using the SSPM bias control in one embodiment of the system of these teachings.

Implementation of temperature compensation circuitry to ensure stability of SSPM operation is another key aspect of this development. In one embodiment, such a sensor has been implemented for monitoring space weather, where an AD590 transducer (see Analog Device data sheet 2-terminal IC temperature transducer, which is incorporated by reference herein in its entirety and for all purposes) is used to measure the temperature. The AD590 produces a constant current dependent on the temperature (1 μA/K). The current is used to produce a voltage between 0.1-1.2 V using the circuit in FIG. 10. The voltage produced is used to reference a DC/DC boost circuit and control the SSPM bias to achieve gain stability. The histograms obtained from the temperature compensated device over a wide temperature range by illuminating with a 465 nm LED are shown in FIG. 11. As can be seen from the figure, this is a linear fit, the standard deviation of which increases with temperature due to the increase in dark noise for the SSPM.

To evaluate the performance of the SSPM, it is compared with two other SSPM device configurations. The devices compared include: 1) a PS-SSPM with internal resistively coupled anodes, 2) a 6×6 segmented SSPM using 6×6 SSPM blocks coupled to an external resistive network, and 3) a 6×6 segmented SSPM with dedicated custom-made 36-channel readout. These characteristics are measured for each configuration: the room temperature noise floor, the dependence of the signal waveform on the location in the device, and the dependence of the charge division on the location of the event on the device. A pulsed LED coupled to an optical fiber is scanned across the surface of the PS-SSPM to measure the signal waveforms, and a continuous LED quantifies the position dependence of the charge division. The signal waveforms quantify the effect of capacitance and filtering on the propagation of the charge pulse through the network resistor.

A hybrid CMS CsI:T1-on-LYSO scintillator was fabricated and its response was plotted to $^{18}$F (FIG. 4). In order to maximize the β signal from the CsI:T1, a transparent structure with wide microcolumns (~100 lim) was achieved for efficient light generation and transport. Transparent CMS film growth requires that LYSO substrates be maintained at high temperatures, ranging from 250° C. to 400° C. during deposition, requiring a specially designed substrate heater system with automated power control to ensure constant temperature throughout the process. This requires investigation to determine the optimum growth conditions in multi-parametric experiments involving CsI:T1 intrinsic material properties, deposition parameters such as source and substrate temperatures, process pressure, and applied power, plus substrate configurations. Characterization of the resulting films in terms of morphology, T1 dopant concentration, and scintillation yield is performed, and the information generated is correlated with the deposition parameters. Reflective and protective coatings to maximize light conservation and ensure probe durability are also explored. The development of coatings require special attention, as these coatings will need to minimally attenuate the incident β events while providing an effective moisture barrier and mechanical protection to the scintillator. Specifically, some of the experimental hybrid scintillator films are subjected to both aluminum reflective layer deposition and protective coating, such as, but not limited to, Parylene, while others are coated with the Parylene protective layer only. A proprietary moisture barrier for certain NASA applications that is only ~500 nm thick and also acts mechanically as a hard coat to protect parts has been developed. In another embodiment, alternating layers of $Al_2O_3$ and $HfO_2$ thin films each measuring few nm are deposited on CsI using ALD. ALD provides a highly conformal growth that covers the CsI surface and can be deposited at a suitably low temperature of ~150° C. The required thickness for a complete moisture barrier, in this embodiment, is ~50 nm, thin enough to permit transmission of βs and visible light photons.

A reflector on CsI improves the SNR and enhances the β-image contrast. A suitable reflector for CsI (540 nm photons) is aluminum metal, which offers up to 90% reflection at 100 nm thickness. The Al deposition is achieved by thermal evaporation process.

A final hard-coat is necessary to provide a robust protection for the reflector from oxidizing as well as providing the required level of safety for the patients. In one embodiment, these coats are typically made of ceramic or refractory materials such as TiN, BN, $Al_2O_3$, and $Lu_2O_3$. In one instance, ALD $Al_2O_3$ measuring 50-100 nm is deposited on Al reflectors to serve as hard coat.

Figures 5A, 5B, 5C, 5D:
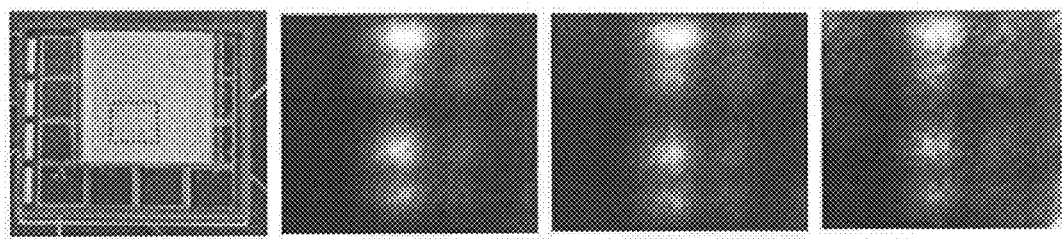
FIG. 5a shows a pixelated (500 square pixels) microcolumnar CsI:T1 of these teachings coupled to a 4×4 SiPM array of these teachings with 3 mm×3 mm pixel size; the red square denotes the 3 mm square active area as used in a test set up.
FIGS. 5b-5d show results from a test.

The hybrid scintillators selected on the basis of performance are bonded to the PS-SSPMs of the claimed teachings. The resulting prototype sensor heads are tested using sealed β and γ sources ($^{90}$Sr and $^{22}$Na). The pulse shape discrimination circuitry is implemented and utilized to study the efficacy of distinguishing slowly varying beta signals from gamma background. A prototype IBP sensor at MGH using $^{18}$FDG-filled phantoms was tested and built. FIG. 5 shows the high-resolution images of positrons acquired with this device, and the effect of increasing gamma background on the image quality.

The phantom experiments shown in FIG. 5 are designed in order to measure the key performance metrics of (1) spatial resolution, (2) detector response uniformity, (3) sensitivity and (4) the rejection of gammas as a function of increasing background activity. The NEMA Standard for Performance Measurements for Non-Imaging Intraoperative Gamma Probes serves as an excellent guideline for the phantom tests, but need to be extended in the following manner for i3 imaging.

The phantoms used in FIG. 5 are a series of 1 cm×1 cm, 200 μm thick copper foils with 50 lam holes drilled in a square pattern, with center-to-center separation ranging from 100 pm to 2 mm. Foils are sequentially placed on the detector face and 10 μCi of a uniform solution of $^{18}$F are placed in contact on the other side and images acquired. The probe's ability to distinguish individual holes indicate spatial resolution, and variation in the number of events at each hole indicate detector uniformity. Optimal is a detector spatial resolution of about 500 pm and uniformity of the acquired image of <10%.

A drop of 10 μCi of $^{18}$F is placed in the center of the detector face. The resulting count rate is compared to calculations of the detector sensitivity, taking into account solid angle, beta energy loss in the detector cover, detector stopping power, detector-to-SSPM coupling efficiency, SSPM quantum efficiency, and efficiency loss due to dark noise thresholds.

A 10 μCi drop of $^{18}$F is placed in the center of the detector, and a syringe filled with 1 mCi of $^{18}$F is placed at a distance of 30 mm and next at 10 mm from the detector. Typical FDG injection for whole body PET is 10 to 15 mCi, and expected to reduce patient injected dose to less than 5 mCi for IBP surgery. Considering the radioactive decay during a 1-hour uptake and the FDG's spread throughout the body, 1 mCi of $^{18}$F in a syringe is an appropriate gamma background measure. The gamma broadening of the beta image is quantified.

This disclosure includes description by way of example of a device configured to execute functions (hereinafter referred to as computing device) which may be used with the presently disclosed subject matter. The description of the various components of a computing device is not intended to represent any particular architecture or manner of interconnecting the components. Other systems that have fewer or more components may also be used with the disclosed subject matter. A communication device may constitute a form of a computing device and may at least include a computing device. The computing device may include an inter-connect (e.g., bus and system core logic), which can interconnect such components of a computing device to a data processing device, such as a processor(s) or microprocessor(s), or other form of partly or completely programmable or pre-programmed device, e.g., hard wired and or application specific integrated circuit ("ASIC") customized logic circuitry, such as a controller or microcontroller, a digital signal processor, or any other form of device that can fetch instructions, operate on pre-loaded/pre-programmed instructions, and/or followed instructions found in hardwired or customized circuitry to carry out logic operations that, together, perform steps of and whole processes and functionalities as described in the present disclosure.

Each computer program may be implemented in any programming language, such as assembly language, machine language, a high-level procedural programming language, or an object-oriented programming language. The programming language may be a compiled or interpreted programming language.

Each computer program may be implemented in a computer program product tangibly embodied in a computer-readable storage device for execution by a computer processor. Method steps of these teachings may be performed by a computer processor executing a program tangibly embodied on a computer-readable medium to perform functions of these teachings by operating on input and generating output.

In this description, various functions, functionalities and/or operations may be described as being performed by or caused by software program code to simplify description. However, those skilled in the art will recognize what is meant by such expressions is that the functions result from execution of the program code/instructions by a computing device as described above, e.g., including a processor, such as a microprocessor, microcontroller, logic circuit or the like. Alternatively, or in combination, the functions and operations can be implemented using special purpose circuitry, with or without software instructions, such as using Application-Specific Integrated Circuit (ASIC) or Field-Programmable Gate Array (FPGA), which may be programmable, partly programmable or hard wired. The application specific integrated circuit ("ASIC") logic may be such as gate arrays or standard cells, or the like, implementing customized logic by metalization(s) interconnects of the base gate array ASIC architecture or selecting and providing metalization(s) interconnects between standard cell functional blocks included in a manufacturer's library of functional blocks, etc. Embodiments can thus be implemented using hardwired circuitry without program software code/instructions, or in combination with circuitry using programmed software code/instructions.

Thus, the techniques are limited neither to any specific combination of hardware circuitry and software, nor to any particular tangible source for the instructions executed by the data processor(s) within the computing device. While some embodiments can be implemented in fully functioning computers and computer systems, various embodiments are capable of being distributed as a computing device including, e.g., a variety of forms and capable of being applied regardless of the particular type of machine or tangible computer-readable media used to actually effect the performance of the functions and operations and/or the distribution of the performance of the functions, functionalities and/or operations.

The interconnect may connect the data processing device to define logic circuitry including memory. The interconnect may be internal to the data processing device, such as coupling a microprocessor to on-board cache memory or external (to the microprocessor) memory such as main memory, or a disk drive or external to the computing device, such as a remote memory, a disc farm or other mass storage device, etc. Commercially available microprocessors, one or more of which could be a computing device or part of a computing device, include a PA-RISC series microprocessor from Hewlett-Packard Company, an 80×86 or Pentium series microprocessor from Intel Corporation, a PowerPC microprocessor from IBM, a Sparc microprocessor from Sun Microsystems, Inc, or a 68xxx series microprocessor from Motorola Corporation as examples.

The inter-connect in addition to interconnecting such as microprocessor(s) and memory may also interconnect such elements to a display controller and display device, and/or to other peripheral devices such as input/output (I/O) devices, e.g., through an input/output controller(s). Typical I/O devices can include a mouse, a keyboard(s), a modem(s), a network interface(s), printers, scanners, video cameras and other devices which are well known in the art. The inter-connect may include one or more buses connected to one another through various bridges, controllers and/or adapters. In one embodiment the I/O controller includes a USB (Universal Serial Bus) adapter for controlling USB peripherals, and/or an IEEE-1394 bus adapter for controlling IEEE-1394 peripherals.

The memory may include any tangible computer-readable media, which may include but are not limited to recordable and non-recordable type media such as volatile and non-volatile memory devices, such as volatile RAM (Random Access Memory), typically implemented as dynamic RAM (DRAM) which requires power continually in order to refresh or maintain the data in the memory, and non-volatile RAM (Read Only Memory), and other types of non-volatile memory, such as a hard drive, flash memory, detachable memory stick, etc. Non-volatile memory typically may include a magnetic hard drive, a magnetic optical drive, or an optical drive (e.g., a DVD RAM, a CD RAM, a DVD or a CD), or 'other type of memory system which maintains data even after power is removed from the system.

For the purposes of describing and defining the present teachings, it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

These and other features and characteristics, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of claims.

What is claimed is:

1. An imaging probe comprising:
   a slab of crystalline $Lu_{1.8}Y_{0.2}SiO_5$:Ce (LYSO) scintillator;
   a pixelated and crystalline micro-columnar structure (CMS) CsI:T1 scintillator disposed on the slab of crystalline LYSO scintillator; the pixelated crystalline micro-columnar structure (CMS) CsI:T1 scintillator being configured to channel light along micro-columns; and
   a solid-state photomultiplier array disposed under the slab of crystalline LYSO scintillator; the solid-state photomultiplier array optically disposed to receive light emanated from the slab of crystalline LYSO scintillator and the CMS CsI:T1 scintillator.

2. The imaging probe of claim 1 further comprising a reflective layer disposed on the CMS scintillator; the reflective layer configured to reflect back light emanating from the CMS CsI:T1 scintillator.

3. The imaging probe of claim 2 wherein the reflective layer comprises aluminum.

4. The imaging probe of claim 3 wherein the reflective layer has a thickness of about 100 nm.

5. The imaging probe of claim 2 further comprising a protective coating disposed on the reflective layer; wherein the protective coating is substantially transparent to β radiation.

6. The imaging probe of claim 5 wherein the protective coating comprises a material selected from one of a poly(p-xylylene) polymer, TiN, BN, $Al_2O$ or $Lu_2O3$; and wherein a thickness of the protective coating is between about 50 nm and about 100 nm.

7. The imaging probe of claim 1 further comprising an analysis component configured to:
discriminate between light emanating due to β radiation and light emanating due to γ radiation;
determine a background signal from the Eight emanating due to γ radiation; and
subtract the background signal from a signal due to β radiation;
the analysis component being electrically disposed to receive output signals from the solid-state photomultiplier array.

8. The imaging probe of claim 7 wherein the analysis component comprises:
an amplifier component electrically disposed to receive said output signals; and
an analog to digital converter component electrically disposed to receive output from the amplifier component.

9. The imaging probe of claim 7 wherein the analysis component is further configured to apply Anger logic, also referred to as a centroid calculation, to said output signals, in order to determine positions of interactions of β radiation with the CMS CsI:T1 scintillator.

10. The imaging probe of claim 7 wherein the analysis component comprises:
an amplifier component electrically disposed to receive said output signals; and
an analog to digital converter component electrically disposed to receive output from the amplifier component;
wherein Anger logic is applied to outputs of the analog to digital converter component.

11. The imaging probe of claim 1 wherein the slab of crystalline LYSO has a thickness between about 500μ and about 1000 μm; and wherein the CMS CsI:T1 scintillator has a thickness between about 300μ and about 400 μm.

12. A method for making a digital probe, the method comprising:
assembling a hybrid scintillator, the hybrid scintillator being assembled by:
heating a slab of crystalline $Lu_{1.8}Y_{0.2}SiO_5$:Ce (LYSO) scintillator to a temperature between about 250° C. to about 400° C.;
maintaining the slab of crystalline LYSO at the temperature between about 250° C. to about 400° C.;
depositing, after maintaining the slab of crystalline LYSO at the temperature, a crystalline micro-columnar structure (CMS) CsI:T1 scintillator on the slab of crystalline LYSO scintillator; and
bonding a solid-state photomultiplier array to the hybrid scintillator; the solid-state photomultiplier array being bonded to the hybrid scintillator at a surface of the slab of crystalline LYSO, said surface being opposite to a surface of the slab of crystalline LYSO on which the CMS CsI:T1 scintillator was deposited.

13. The method of claim 12 further comprising depositing on the CMS CsI:T1 scintillator a reflective coating.

14. The method of claim 13 further comprising depositing a protective coating on the reflective coating.

15. The method of claim 14 wherein the protective coating comprises a material selected from one of a poly(p-xylylene) polymer, TiN, BN, $Al_2O$, or $Lu_2O3$; and wherein a thickness of the protective coating is between about 50 nm and about 100 nm.

16. The method of claim 13 wherein the reflective layer has a thickness of about 100 nm; and wherein the aluminum is deposited by a thermal evaporation process.

17. The method of claim 12 wherein the CMS CsI:T1 scintillator is deposited by vapor deposition.

* * * * *